United States Patent [19]

Voisine et al.

[11] Patent Number: 5,343,143
[45] Date of Patent: Aug. 30, 1994

[54] SHIELDED CURRENT SENSING DEVICE FOR A WATTHOUR METER

[75] Inventors: John T. Voisine; Christopher L. Anderson; Robert E. Slaven, all of Lafayette; Ronald C. Tate, Battle Ground, all of Ind.

[73] Assignee: Landis & Gyr Metering, Inc., Lafayette, Ind.

[21] Appl. No.: 833,738

[22] Filed: Feb. 11, 1992

[51] Int. Cl.5 .......................................... G01R 11/48
[52] U.S. Cl. ..................................... 324/142; 324/107; 324/117 R
[58] Field of Search ................. 324/117 R, 127, 142, 324/107, 117 H, 225; 336/84 R, 84 C, 84 M

[56] References Cited

U.S. PATENT DOCUMENTS

| | | | |
|---|---|---|---|
| 3,842,186 | 10/1974 | Hall | 336/84 C |
| 3,851,287 | 11/1974 | Miller et al. | 336/84 C |
| 3,996,513 | 12/1976 | Butler | 324/127 |
| 4,318,066 | 3/1982 | Degeneff et al. | 336/84 C |
| 4,362,990 | 12/1982 | Schneider | 324/117 R |
| 4,413,230 | 11/1983 | Miller | 324/127 |
| 4,456,878 | 6/1984 | Gamoh | 324/142 |
| 4,459,576 | 7/1984 | Fox et al. | 336/84 C |
| 4,473,810 | 9/1984 | Souques | 336/115 |
| 4,491,790 | 1/1985 | Miller | 324/127 |
| 4,506,214 | 3/1985 | Lienhard | 324/117 R |
| 4,586,015 | 4/1986 | Takahara | 336/84 C |
| 4,687,987 | 8/1987 | Kuchnir et al. | 324/127 |
| 4,700,131 | 10/1987 | Miller | 324/117 H |
| 4,725,804 | 2/1988 | Yarpezeshkam | 336/84 C |
| 4,749,940 | 6/1988 | Bullock | 324/117 R |
| 4,786,862 | 11/1988 | Sieron | 324/126 |
| 4,864,265 | 9/1989 | Peoples et al. | 336/84 C |
| 4,887,029 | 12/1989 | Hemminger | 324/127 |
| 4,896,106 | 1/1990 | Voisine | 324/142 |
| 4,901,010 | 2/1990 | Banard | 324/117 R |
| 4,947,108 | 8/1990 | Gudel | 324/127 |

Primary Examiner—Vinh Nguyen
Attorney, Agent, or Firm—Woodard, Emhardt, Naughton, Moriarty & McNett

[57] ABSTRACT

A current sensing device includes a secondary coil positioned within the curved portion of a U-shaped primary conductor or coil. The secondary coil is surrounded by a non-ferromagnetic metallic shield to prevent capacitive coupling between the windings of the secondary coil and other nearby metallic objects. A nonconductive material is integrally formed about the U-shaped conductor and provides a cavity for receiving the secondary coil an shield in a predetermined position with respect to the U-shaped conductor. A flux guide of ferromagnetic metal, formed in an elliptical-cylindrical shape, surrounds the U-shaped conductor and the secondary coil to provide a flux steering effect to steer flux around the secondary or pick-up coil. The current sensing device is useful in measuring current in electrical utility power monitoring or watthour meter applications.

25 Claims, 6 Drawing Sheets

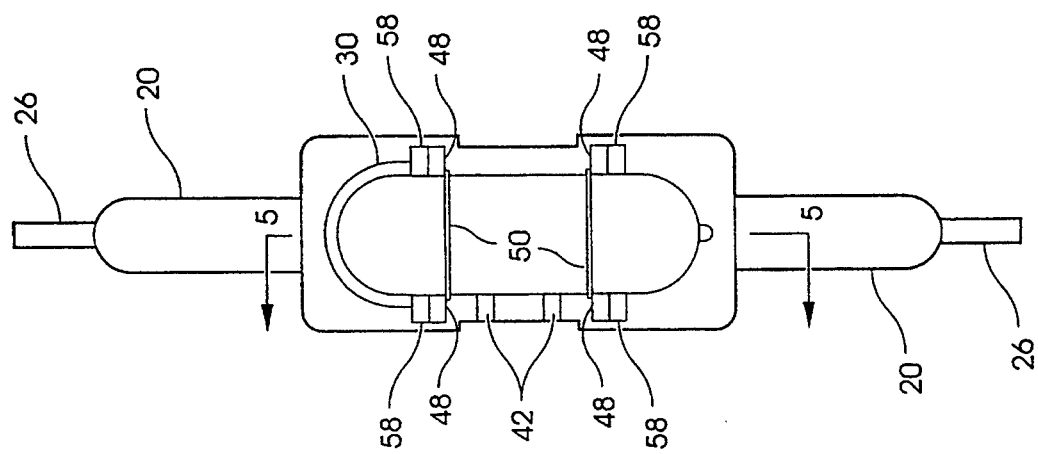
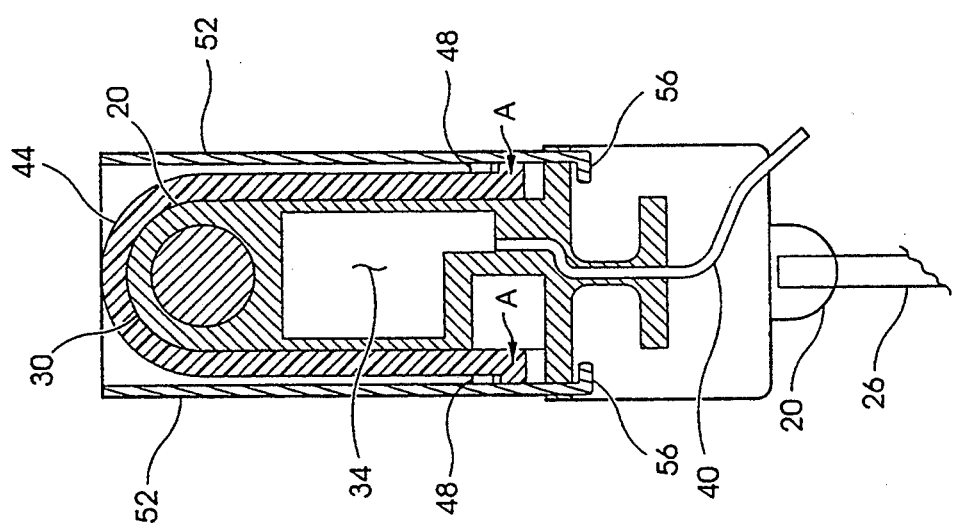

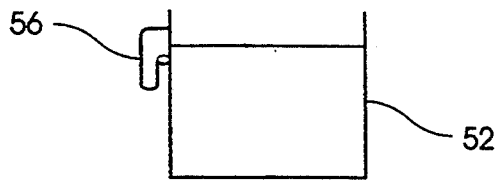
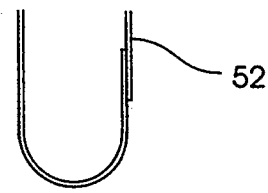
Fig. 6  Fig. 7
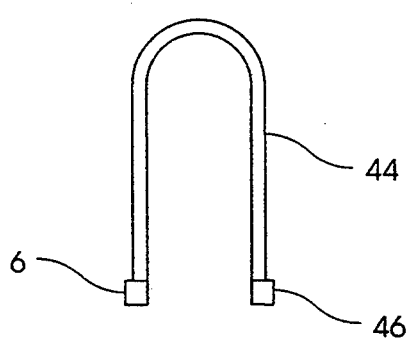
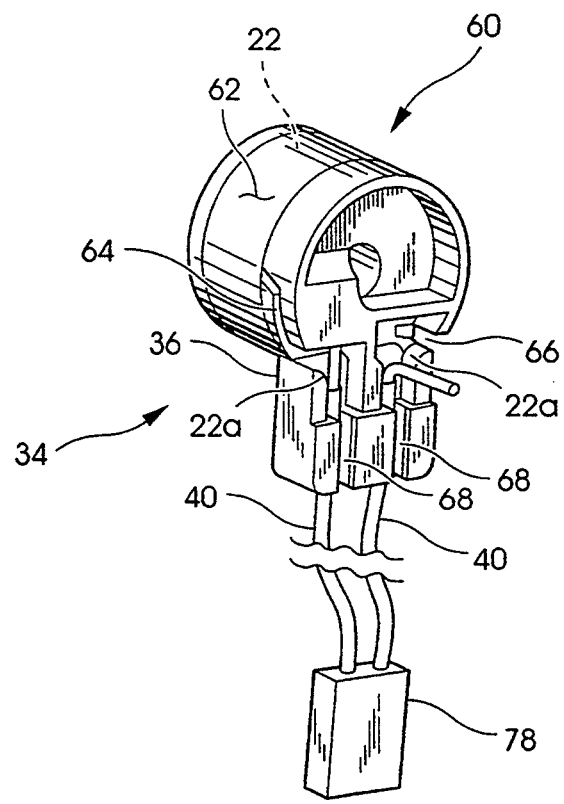
Fig. 8  Fig. 9

SHIELDED CURRENT SENSING DEVICE FOR A WATTHOUR METER

BACKGROUND OF THE INVENTION

The invention relates to inductive current measuring devices and more particularly a current sensing device for use in a power monitoring device or watthour meter.

Two well-known approaches for non-intrusive sensing of current flowing in a conductor are: (1) the transformer approach wherein inductive coupling between a primary coil (the conductor in which current is to be measured) and a secondary coil generates a voltage in the secondary coil proportional to the current flowing in the primary coil; and (2) using a current sensor, such as a Hall-effect device to sense the magnetic field associated with current flow in the conductor. With the first approach, accurate detection of the current flowing through the primary coil is dependent upon a variety of factors. In addition to the typical turns ratio calculation, interference attributable to capacitive coupling between the surface of the secondary coil and nearby metallic structures interferes with the accuracy of the voltage signal induced in the secondary coil.

Additional considerations in the design of a current detecting sensor are presented when a watthour meter design must measure current from low amperage up to 200 amps flowing in a conductor or primary winding. In addition, the current detecting device must be unaffected by current flowing in conductors situated nearby.

Various prior devices are known for detecting current flowing in a conductor. U.S. Pat. No. 4,473,810 to Souques et al. discloses an AC current sensor for measuring the current flowing in a conductor. Souques discusses an insulating frame having a central compartment open at its upper end and encompassed by a U-shaped receptacle for a bent portion of the conductor is disclosed. A coil is housed in the central compartment. The frame is slidingly mounted within a sleeve having two assembled half-shells made of a soft magnetic material. The voltage generated is proportional to the intensity of current flowing in the main or primary conductor.

Another example of a current detection device is disclosed in U.S. Pat. No. 4,506,214 to Lienhard et al. Lienhard et al. discloses a measuring transformer including a measuring conductor carrying a current $I_m$ to be measured, a premagnetizing winding which carries a premagnetizing current $I_v$, and a magnetic field comparing means which is exposed to the magnetic field produced by the current $I_m$ and the magnetic field produced by the premagnetizing current $I_v$. This comparing means is alternately controlled in both directions of saturation. The magnetic field comparing means in one embodiment is a magnetic film (which may be anisotropic) operated in the magnetic preferential direction, and has a thickness of at most a few microns. It may be secured to pole shoes of a magnetic core or arranged between a flat measuring conductor and a premagnetizing coil of flat cross-section. The measuring transformer can be used as an input transformer in a static electricity meter. In another embodiment, output pulses are obtained directly from a magnetic field comparing means.

Another example of a current sensing device is disclosed in U.S. Pat. No. 4,362,990 to Schneider et al. The Schneider et al. device includes a transducer for measuring a current, which is comprised of a magnetic core having a gap substantially impeding passage of any magnetic flux, a coil arranged to pass a premagnetizing current for producing a first magnetic field, a loop for carrying the current to be measured, so as to produce a second magnetic field, and a magnetic field comparison device exposed to the magnetic fields. The magnetic field comparison device includes a magnetic film bridging the flux gap. The film is alternately controllable in respective opposite directions of saturation substantially by the first magnetic field, and evaluates the measuring current in dependence of the magnetic fields. The magnetic core, the coil, the loop, and the magnetic film are substantially concentric.

None of the known devices include a means for preventing coupling between the secondary pick-up coil and surrounding metallic structures to thereby enhance the accuracy of the signal in the secondary coil. Thus a need remains for an improved current sensing device for sensing current having high accuracy coupled with high linearity is needed for use in conjunction with watthour meter systems known in the art.

SUMMARY OF THE INVENTION

A device for detecting AC current flowing in a conductor according to one aspect of the present invention comprises a conductor having a U-shaped curved portion, a coil secured in spaced apart relation within the curved portion of the conductor, the coil having a first lead and a second lead extending therefrom. A metallic shield substantially surrounds the coil and is disposed between the conductor and the coil. The shield is electrically connected to the first lead. Flux guide means is also provided which is disposed over the U-shaped conductor and the coil, such that the flux guide means diverts and concentrates magnetic flux from the area surrounding the U-shaped conductor in the direction of the coil. AC current flowing in the conductor induces a corresponding signal in the coil.

A watthour meter device according to another aspect of the present invention comprises a curved conductor, and means for sensing voltage in the curved conductor, and means for sensing current flowing through the conductor. More particularly, the means for sensing current includes means for detecting a magnetic field, which is disposed in close proximity with the curved conductor, and which produces a signal corresponding to the intensity of the magnetic field emanating from the curved conductor. The means for sensing current further includes a metallic shield interposed between the means for detecting and the conductor and substantially surrounding the means for detecting. The shield is electrically connected to a ground potential. Flux guide means is also provided which surrounds the shield, the conductor and the means for detecting, and which functions to divert magnetic flux produced by current flowing in the conductor towards the coil.

One object of the present invention is to provide an improved current sensing device. Another object of the present invention is to provide a current sensing device having improved performance under adverse conditions.

A further object of the present invention is to provide a non-intrusive current sensing device capable of accurately measuring current flowing in a conductor when the current is of a magnitude typically required in measuring commercial or residential electricity consumption.

Yet another object of the present invention is to provide a watthour meter having improved performance characteristics with regard to accuracy and reliability under a multitude of adverse conditions including close proximity to metallic objects and other interfering electromagnetic field signals.

These and other objects of the present invention will become more apparent from the following description of the preferred embodiment.

BRIEF DESCRIPTION OF THE DRAWINGS

FIG. 3 is a cross-sectional view of the current sensing device of FIG. 2 taken along line 3—3 as viewed in the direction of the arrows.

FIG. 4 is a plan view of the current sensing device of FIG. 2 with the flux guide and retainer removed.

FIG. 6 is an elevational view of the flux guide of FIG. 2.

FIG. 7 is a top view of the flux guide shown in FIG. 6.

FIG. 8 is a side view of the retainer shown in FIG. 2.

FIG. 9 is an orthographc perspective view of the coil assembly with the Faraday shield removed.

DESCRIPTION OF THE PREFERRED EMBODIMENT

Figure 1:
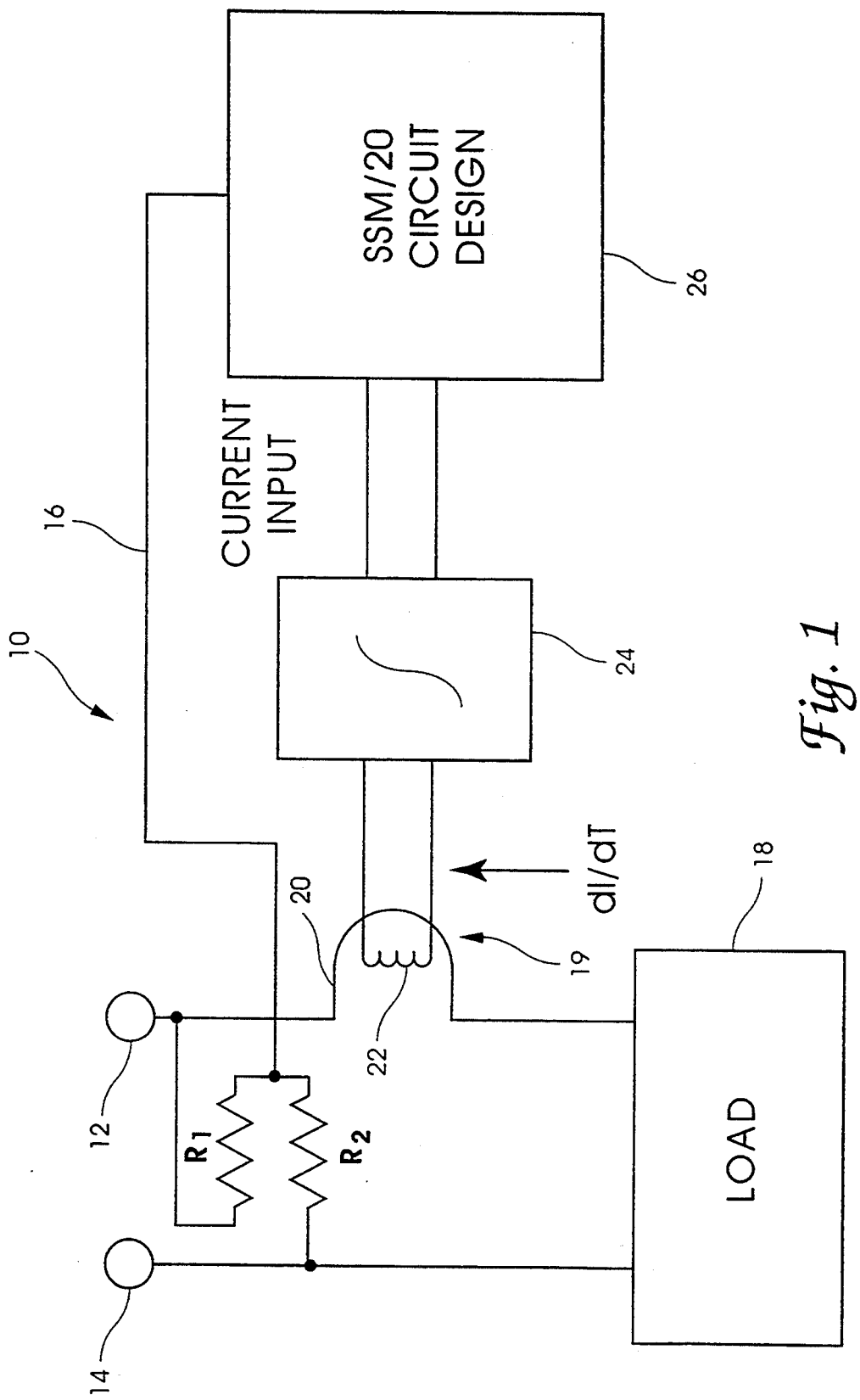
FIG. 1 is a block diagram of a power measurement device or watthour meter according to the present invention.
Figure 2:
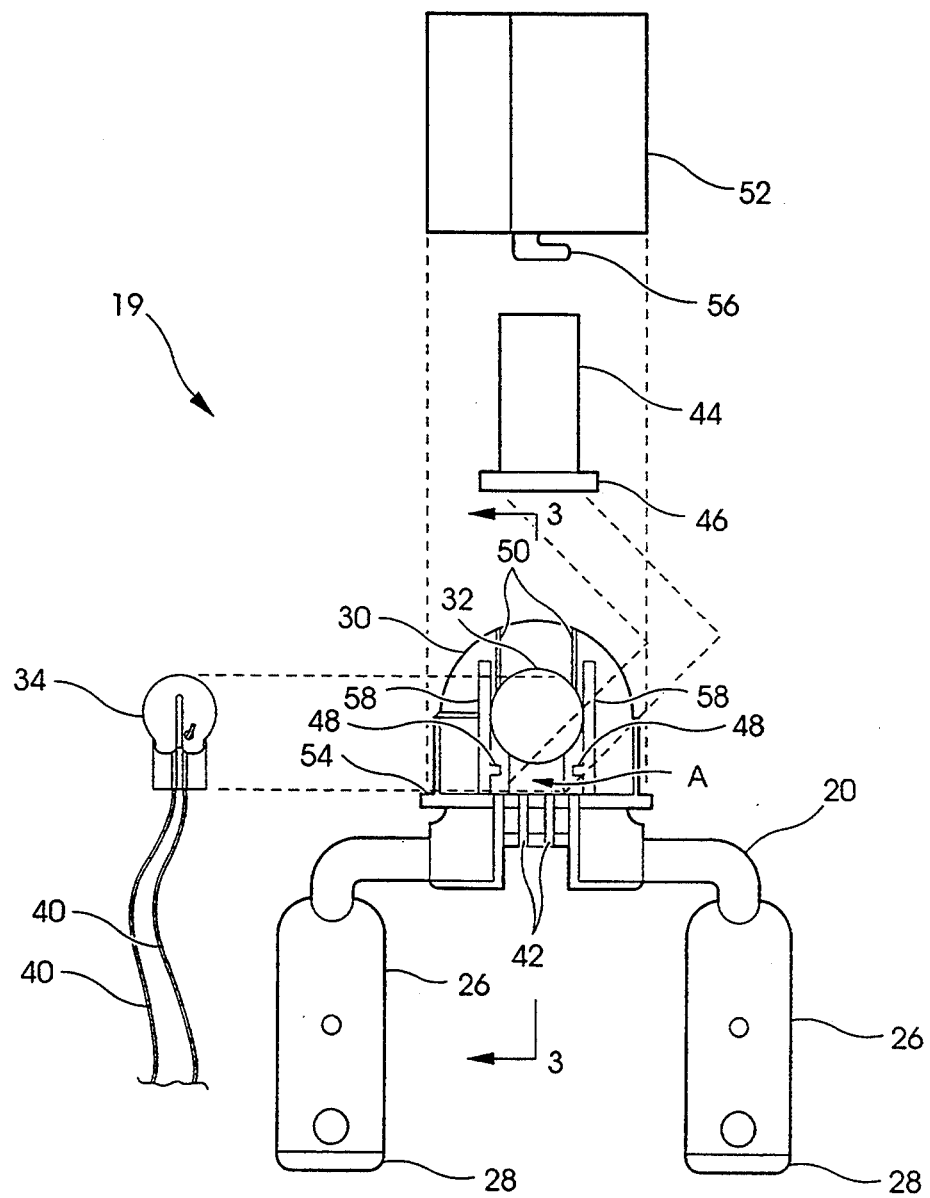
FIG. 2 is an exploded front elevational view of a current sensing device according to the present invention.

For the purposes of promoting an understanding of the principles of the invention, reference will now be made to the embodiments illustrated in the drawings and specific language will be used to describe the same. It will nevertheless be understood that no limitation of the scope of the invention is thereby intended, such alterations and further modifications in the illustrated device, and such further applications of the principles of the invention as illustrated therein being contemplated as would normally occur to one skilled in the art to which the invention relates.

Referring now to FIG. 1, a block diagram of a power measurement device 10 according to the present invention is shown. In one preferred embodiment, the power measurement device 10 is a watthour meter which is used to measure power flowing into a two port network represented by terminals 12 and 14. The voltage supplied to load 18 is applied to terminals 12 and 14 and is detected in this embodiment via a resistor divider network created by resistors $R_1$ and $R_2$. (The voltage can also be detected using a conventional voltage transformer known in the art.) The voltage appearing on signal path 16 from the resistor divider network corresponds or is proportional to the voltage potential appearing across terminals 12 and 14.

Accurate determination of actual electrical power consumption (resistive power and/or reactive power) is determined in accordance with an analysis of the voltage supplied to the load, in direct conjunction with the current flowing through the load 18. AC current entering terminal 12 and passing through load 18 induces a corresponding current to flow in the coil 22. The magnitude of the signal induced in coil 22 corresponds directly with the magnitude of current flowing in the U-shaped conductor 20, and more particularly as the time derivative (di/dt) of that current. The signal from coil 22 is integrated by integrator circuit 24 with the output being supplied to a power analysis circuit 26. The signal corresponding to the voltage across terminals 12 and 14 is also supplied to the circuit 26 on signal path 16. In response to the signals supplied to its inputs corresponding to voltage and current, circuit 26 analyzes the signals and provides a means for determining power consumption in load 18 over a period of time. Circuit 26 may be coupled to an electronic or mechanical display for indicating power consumption, or an electronic connection to circuit 26 may be provided to enable transfer of data to a digital data receiving device (not shown), wherein the digital data describes the electrical power consumed by load 18.

One example of the circuitry of block 26 is found in a model No. SSM/20 watthour meter manufactured by Landis & Gyr Metering, Inc. of 3601 Sagamore Parkway North, Lafayette, Ind. 47903, which incorporates a mark-space oscillator watt transducer circuit. The operation of the Landis & Gyr SSM/20 W No. 4,896,106 entitled Watthour Meter For Wye Connected Systems, which is owned by the Assignee of this application, the disclosure of which is incorporated herein by reference.

An embodiment of the improved current sensing device 19 of FIG. 1, including the primary coil or U-shaped conductor 20 and secondary or pick-up coil 22 in accordance with the present invention, is shown in FIGS. 2-5. Reference to these figures is now made. The current sensing device 19 includes U-shaped conductor 20. Blades 26 are integrally formed from the conductor 20 for convenient interconnection in series with an electrical circuit such as that shown in FIG. 1. The blades 26 include tapered ends 28 to enable convenient insertion into an electrical receptacle. Conductor 20 is preferably formed from a single piece of metallic material, such as copper, and is plated with an electro-tin plating to prevent build-up of oxides on the surface thereof.

Figure 5:
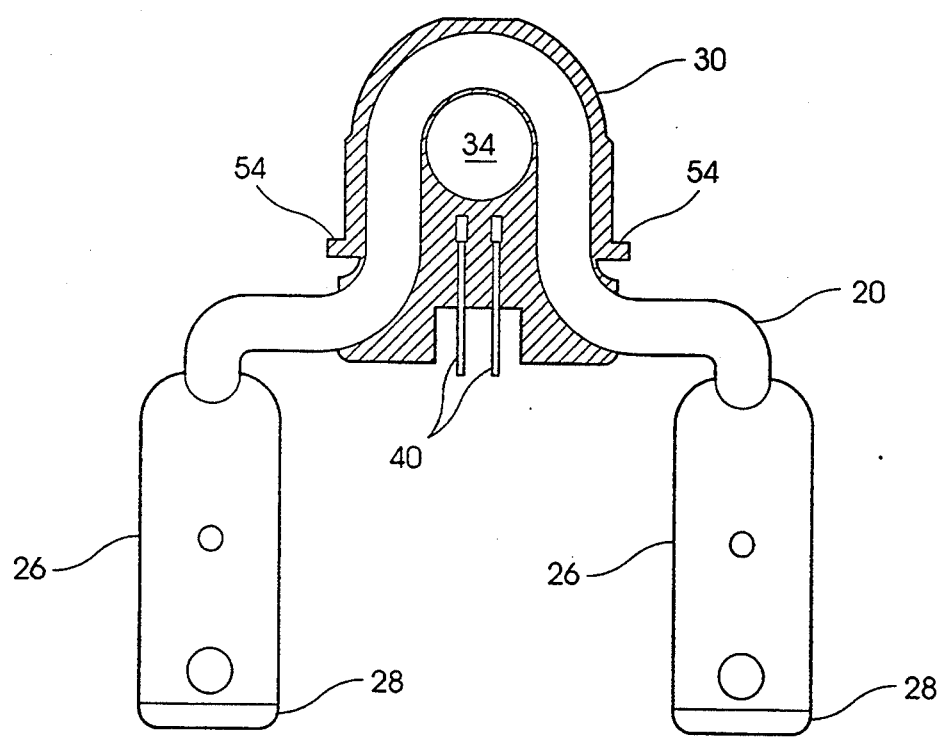
FIG. 5 is a cross-sectional view of the current-sensing device of FIG. 4 taken along line 5—5 as viewed in the direction of the arrows.

The conductor 20 is contained within a nonconductive polymer or plastic insulator 30 which is preferably integrally molded onto the conductor as seen more clearly in FIG. 5. Plastic insulator 30 defines a cavity 32 at a predetermined location with respect to conductor 20. Coil assembly 34, which includes coil 22, bobbin 36 (shown in FIG. 9) and shield 38 (shown in FIGS. 10 and 11), is removably inserted into cavity 32 at the predetermined location. Precise positioning of coil assembly 34 with respect to conductor 20, via cavity 32, achieves one objective of accurate positioning of the secondary coil (conductor 20) with respect to the primary coil (coil 22). Conductors 40 which provide a means for electrical connection to the coil 22 and are received in respective ones of the slots 42. Retainer 44 (also shown in FIG. 8) resembles an inverted "U" and resiliently straddles the plastic insulator 30 to aid in retaining coil assembly 34 within cavity 32 as shown in FIG. 3. Retainer 44 is made of a resilient nonconductive material, such as plastic or other polymer material. Edges 46 are separable so that the edges 46 may pass over tabs 48. Thus, retainer 44 is secured in position when edges 46 are released and allowed to clamp into a slot defined by tabs 48 and ribs 58 at location A on the front and rear sides of insulator 30. The rear surface of insulator 30 is a mirror image of that shown in FIG. 2 with the exception that cavity 32 does not open at the rear surface of insulator 30. Additional ribs 50 prevent retainer 44 from moving laterally with respect to insulator 30.

Flux guide 52 (see FIGS. 6 and 7) is an elliptical metallic open-ended cylinder or sleeve made of ferromagnetic material. Flux guide 52 is slidably positioned over insulator 30 once coil assembly 34 and retainer 44 are positioned in their respective locations. Flux guide 52 is secured against lip 54 when tabs 56 (one on each side of the elliptically shaped cylinder 52) are bent towards each other beneath lip 54 after flux guide 52 has been installed in adjacent relationship with lip 54 as shown in FIG. 3. Ribs 58 protrude from the surface of insulator 30 and provide a spacing mechanism for maintaining the position of flux guide 52 with respect to coil assembly 34 when flux guide 52 is installed over the insulator 30. Flux guide 52 is ungrounded and electrically floating.

Referring now to FIG. 9, coil assembly 34 is shown with shield 38 removed. Coil assembly 34 includes bobbin 36 about which approximately 5400 turns of No. 43 copper magnet wire is wound to form coil 22. The magnet wire (not shown) is wound within channel 60 and adhesive tape 62 is wrapped over the magnet wire to prevent damage thereto and retain the wire within channel 60. End leads 22a of the magnet wire are positioned within slots 64 and 66 and are wound about the exposed ends of insulated conductors 40. Insulated conductors 40 are positioned within parallel channels 68. Solder is applied to the exposed end of conductors 40 to ensure a good electrical connection between the end leads 22a of the coil 22 and the conductors 40. Connector 78 enables convenient connection of the coil assembly 34 to the integrator circuit 24 of FIG. 1.

Figure 10:
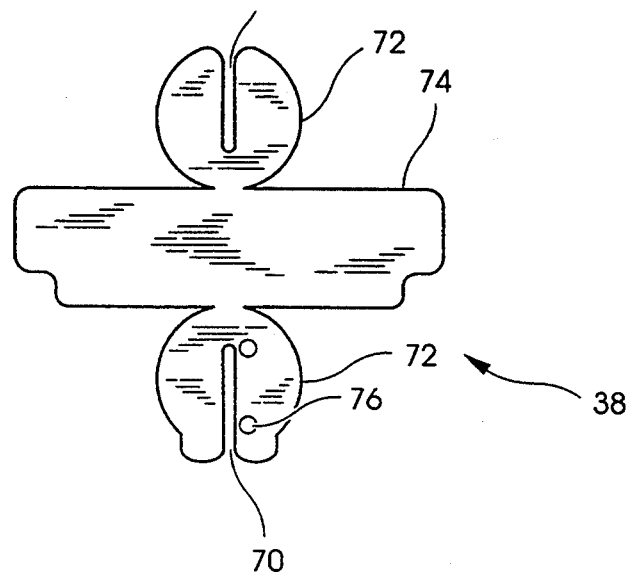
FIG. 10 is a plan view of a sheet metal stampling used to form the Faraday shield surrounding the secondary or pick-up coil.
Figure 11:
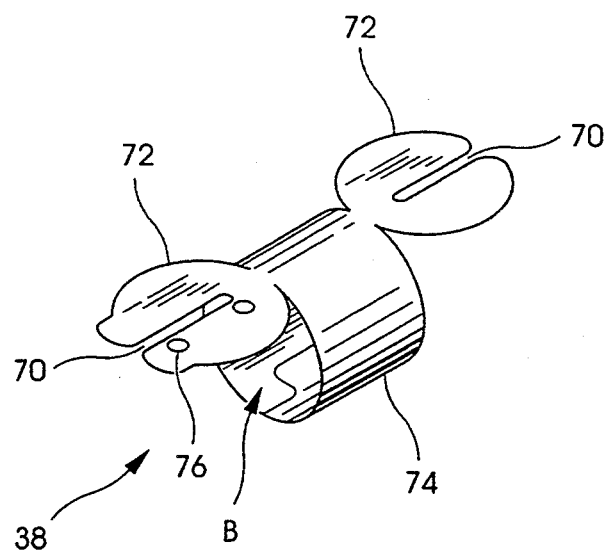
FIG. 11 is an orthographic view of the sheet metal shown in FIG. 10 after the sheet metal is bent to form a cylinder for receiving the coil/bobbin assembly therein.

Referring now to FIGS. 10 and 11, the shield 38 is shown. FIG. 10 provides a plan view of the shield 38 after it has been stamped or coined from a flat sheet of non-ferromagnetic, preferably metallic, material. Shield 38 is preferably stamped from a brass alloy. Shield 38 includes slots 70 that minimize the effect of circulating eddy currents in the end faces 72 of shield 38 thereby providing improved accuracy in the signal induced in coil 22. Lateral surface 74 is formed into a cylindrical shape (FIG. 11) so that bobbin 36 (with the secondary coil 22 wound about it) may be inserted into the cavity defined by the shield 38 at location B. After bobbin 36 is inserted at B, end faces 72 are bent down so that the shield 38 completely surrounds the lateral and end surfaces of the bobbin with secondary coil 22 wound thereon. One of the bare ends of conductors 40 is inserted through hole 76 and electrically attached or soldered to the shield 38. Preferably, the conductor 40 attached to the shield 38 is the ground potential lead, electrically speaking, so that shield 38 operates as a Faraday or electrostatic shield and prevents capacitive coupling between the secondary coil 22 and nearby metallic surfaces. Shield 38 does not interfere with or affect the magnetic field or flux passing through shield 38.

Eliminating charge build-up on coil 22 (via shield 38) improves the accuracy of the signal produced by sensor 19. Further, flux guide 52 is a magnetic shield preventing external magnetic fields from affecting the output signal of coil 22. Flux guide 52 acts as a magnetic shunt to shunt or steer the magnetic field away from the middle (or coil 22 area) of the sensor 19.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A watthour meter device connected to a source of AC current and voltage for registering AC electrical energy consumption, the device comprising:
   voltage sensing means for producing a first signal in relation to the AC voltage;
   current sensing means for producing a second signal in relation to the AC current, said current sensing means including;
   a curved conductor connected to said source of AC current;
   means for detecting a magnetic field, said means for detecting disposed in close proximity with said curved conductor and producing a signal corresponding to the intensity of the magnetic field emanating from said curved conductor;
   a non-ferromagnetic metallic shield interposed between said means for detecting and said conductor and substantially surrounding said means for detecting, wherein said shield is electrically connected to a ground potential; and
   flux guide means surrounding said shield, said conductor and said means for detecting, said flux guide means diverting a portion of a magnetic field, produced in response to the AC current flowing in said conductor, towards said means for detecting and wherein said flux guide means is constructed of a ferromagnetic material; and
   means for calculating AC electrical energy consumption from said first signal and said second signal.

2. The device of claim 1 wherein said curved conductor is U-shaped, said means for detecting is a coil having a first lead and a second lead extending therefrom, and said metallic shield is grounded.

3. The device of claim 2 including an insulator attached to and insulating said U-shaped conductor and defining a cavity located within the U-shaped portion of said U-shaped conductor, said coil and said metallic shield being disposed within said cavity, said flux guide means being disposed over said insulator.

4. The device of claim 3 wherein said metallic shield is a closed cylinder including an opening through which said first and second leads are inserted and wherein said shield includes means for preventing eddy currents in said shield.

5. The device of claim 4 wherein said flux guide means is an open and substantially elliptical open-based cylinder.

6. The device of claim 5 wherein said means for preventing eddy currents is a slot in the bases of said closed cylinder.

7. The device of claim 1 wherein the current signal represents the time derivative of the current flowing through the conductor and the means for calculating includes an integrator applied to said current signal.

8. A watthour meter device connected to a source of AC current and voltage for registering AC electrical energy consumption, the device comprising:
  voltage sensing means for producing a first signal in relation to the AC voltage;
  current sensing means for producing a second signal in relation to the AC current, said current sensing means including:
    a U-shaped conductor connected to said source of AC current;
    a coil for detecting a magnetic field, said coil having a first lead and a second lead extending therefrom, said coil disposed in close proximity with said curved conductor and producing a signal at said first and second leads corresponding to the intensity of the magnetic field emanating from said U-shaped conductor;
    a metallic shield connected to ground potential, said shield interposed between said coil and said conductor and substantially surrounding said coil, said metallic shield being stamped from a single sheet of metal and formed therefrom into a closed cylinder about said coil, said shield including an opening through which said first and second leads are inserted and slots in the bases of said closed cylinder to reduce eddy currents, and wherein said metallic shield is made of a non-ferromagnetic material;
    flux guide means surrounding said shield, said conductor and said coil, said flux guide means diverting a portion of a magnetic field, produced in response to the AC current flowing in said conductor, towards said coil, wherein said flux guide means is an open and substantially elliptical open-based cylinder made of ferromagnetic material;
    an insulator attached to and insulating said U-shaped conductor and defining a cavity located within the U-shaped portion of said U-shaped conductor, said coil and said metallic shield being disposed within said cavity, said flux guide means being disposed over said insulator; and
  means for calculating AC electrical energy consumption from said first signal and said second signal.

9. A device for detecting AC current flowing in a conductor comprising:
  a conductor having a U-shaped curved portion;
  a coil secured in spaced apart relation within said curved portion of said conductor, said coil having a first lead and a second lead extending therefrom;
  a non-ferromagnetic metallic shield substantially surrounding said coil and disposed between said conductor and said coil, wherein said metallic shield is a closed cylinder including an opening through which said first and said second leads are inserted and wherein said shield includes means for preventing eddy currents in said shield, and wherein said shield is electrically connected to said first lead;
  flux guide means disposed over said U-shaped conductor and said coil, wherein said flux guide means diverts and concentrates magnetic flux from the area surrounding said U-shaped conductor in the direction of said coil and wherein said flux guide means is constructed of a ferromagnetic material; and
  wherein AC current flowing in said conductor induces a proportional signal in said coil.

10. The device of claim 9 including an insulator disposed between and attached to both said U-shaped conductor and said shield.

11. The device of claim 10 wherein said flux guide means is electrically isolated and floating.

12. The device of claim 10 wherein said flux guide means is a substantially elliptically shaped cylinder having an opening wherein said curved portion of said U-shaped conductor is received through said opening of said elliptically shaped cylinder.

13. The device of claim 12 wherein said conductor includes blades for engaging a source of AC current and wherein said means for preventing eddy currents is a slot in said closed cylinder metallic shield.

14. A device for detecting AC current flowing in a conductor, said device comprising:
  a coil having a first lead and a second lead extending therefrom, said coil having an axis about which the coil is wound;
  a curved conductor located in close proximity with said coil, said conductor disposed in a plane substantially perpendicular to said axis wherein current flowing in said conductor induces a proportional current signal in said coil;
  a non-ferromagnetic metallic shield interposed between said coil and said conductor and substantially surrounding said coil, wherein said shield is electrically connected to said first lead, and said second lead is insulated from and extends through said shield, and wherein said metallic shield is a closed cylinder including an opening through which said first and said second leads are inserted and wherein said shield includes means for preventing eddy currents in said shield; and
  flux guide means encircling said shield, said conductor and said coil, said flux guide means diverting flux produced by current flowing in said conductor towards said coil and wherein said flux guide means is constructed of a ferromagnetic material.

15. The device of claim 14 wherein said conductor includes a curved portion which encircles approximately 180 degrees of said coil.

16. The device of claim 15 wherein said coil is wound about a bobbin.

17. The device of claim 16 including insulator means attached to said conductor, and wherein said insulator means includes a void for receiving said coil and said shield therein.

18. The device of claim 17 wherein said shield includes slots therein to reduce eddy currents induced in said shield by current flowing in said conductor.

19. The device of claim 18 wherein said flux guide means is a metallic cylinder surrounding said curved portion of said conductor and said coil within said shield.

20. The device of claim 19 wherein said coil is a multi-turn coil and said insulator means is plastic integrally molded about said curved portion of said conductor.

21. A device for detecting AC current flowing in a conductor, said device comprising:
  a multi-turn coil wound about a bobbin and having a first lead and a second lead extending therefrom, said coil having an axis about which the coil is wound;
  a curved conductor located in close proximity with said coil and encircling approximately 180 degrees of said coil, said conductor disposed in a plane substantially perpendicular to said axis;

a metallic shield stamped from a sheet of metal and bent into configuration about said coil, said shield interposed between said coil and said conductor and substantially surrounding said coil, wherein said shield is electrically connected to said first lead, and said second lead is insulated from and extends through said shield, and wherein said shield includes slots therein to reduce eddy currents induced in said shield by current flowing in said conductor;

insulator means attached to said conductor, wherein said insulator means includes a void for receiving said coil and said shield therein, and wherein said insulator means is made of plastic integrally molded about said curved conductor; and flux guide means encircling said shield, said conductor and said coil, said flux guide means diverting flux produced by current flowing in said conductor towards said coil, said flux guide means being a metallic cylinder surrounding said curved portion of said conductor and said coil within said shield.

22. A device for detecting current flowing in a conductor, said device comprising:

a curved conductor;

means for detecting a magnetic field, said means for detecting disposed in close proximity with said curved conductor and producing a signal proportional to the intensity of the magnetic field emanating from said curved conductor;

a non-ferromagnetic metallic shield interposed between said means for detecting and said conductor and substantially surrounding said means for detecting, wherein said metallic shield is a closed cylinder including an opening through which said first and said second leads are inserted and wherein said shield includes means for preventing eddy currents in said shield and wherein said shield is electrically connected to a ground potential; and flux guide means surrounding said shield, said conductor and said means for detecting, said flux guide means diverting magnetic flux produced by current flowing in said conductor towards said coil and wherein said flux guide means is constructed of a ferromagnetic material.

23. The device of claim 22 wherein said flux guide is electrically floating and wherein said shield includes means for reducing eddy currents.

24. The device of claim 23 wherein said flux guide means is an open-ended metallic cylinder, said shield is a substantially closed cylinder, and said means for reducing eddy currents is at least one slot in said shield.

25. The device of claim 24 including insulator means attached to said curved conductor and including a void within which said means for detecting is mounted.

* * * * *

UNITED STATES PATENT AND TRADEMARK OFFICE
CERTIFICATE OF CORRECTION

PATENT NO. : 5,343,143

DATED : August 30, 1994

INVENTOR(S) : John Corcoran et al.

It is certified that error appears in the above-identified patent and that said Letters Patent is hereby corrected as shown below:

Column 2, line 38, delete "older" and substitute therefor --other--;

Column 2, line 51, after "vacuum", insert --hood--.

Signed and Sealed this

Eighth Day of November, 1994

*Attest:*

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,343,143
DATED : August 30, 1994
INVENTOR(S) : John T. Voisine, et al It is certified that error appears in the above-indentified patent and that said Letters Patent is hereby corrected as shown below:

This certificate supersedes Certificate of Correction issued November 8, 1994, the number was erroneously mentioned and should be deleted since no Certificate of Correction was granted.

Signed and Sealed this

Twenty-second Day of August, 1995

Attest:

BRUCE LEHMAN

Attesting Officer     Commissioner of Patents and Trademarks